United States Patent
Ho et al.

(10) Patent No.: US 10,863,620 B1
(45) Date of Patent: Dec. 8, 2020

(54) BENDABLE CIRCUIT BOARD AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Ming-Jaan Ho, New Taipei (TW); Hao-Wen Zhong, Shenzhen (CN); Biao Li, Shenzhen (CN); Man-Zhi Peng, Huaian (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 16/884,431

(22) Filed: May 27, 2020

(30) Foreign Application Priority Data

May 11, 2020 (CN) .......................... 2020 1 0391937

(51) Int. Cl.
*H05K 1/02* (2006.01)
*H05K 3/00* (2006.01)

(52) U.S. Cl.
CPC ......... *H05K 1/0278* (2013.01); *H05K 3/0032* (2013.01); *H05K 2203/107* (2013.01)

(58) Field of Classification Search
CPC .............. H05K 1/0278; H05K 3/0032; H05K 2203/107
USPC ........................................... 174/254; 361/749
See application file for complete search history.

(56) References Cited

U.S. PATENT DOCUMENTS

| | | | | |
|---|---|---|---|---|
| 5,004,639 A | * | 4/1991 | Desai | ........................ B32B 7/02 428/138 |
| 2011/0180306 A1 | * | 7/2011 | Naganuma | ............. H05K 1/115 174/254 |
| 2011/0203837 A1 | * | 8/2011 | Naganuma | ........... H05K 3/4691 174/254 |

* cited by examiner

*Primary Examiner* — Sherman Ng
(74) *Attorney, Agent, or Firm* — ScienBiziP, P.C.

(57) ABSTRACT

A bendable circuit board includes a first rigid wiring board, a first flexible film, a circuit substrate, a second rigid wiring board, a second flexible film, and a third rigid wiring board which are stacked in said order. The circuit substrate is a rigid double-sided circuit board. The first rigid wiring board defines a first window area in which the first flexible film is exposed, and the third rigid wiring board defines a second window area in which the second flexible film is exposed. The present disclosure further provides a method for manufacturing the bendable circuit board.

10 Claims, 8 Drawing Sheets

BENDABLE CIRCUIT BOARD AND METHOD FOR MANUFACTURING THE SAME

FIELD

The subject matter herein generally relates to circuit boards, and particular to a bendable circuit board and a method for manufacturing the same.

BACKGROUND

A bendable circuit board is widely used in an electronic device to enable three-dimensional assembly of components. The bendable circuit board can be a rigid-flexible board, a flexible board, or a semi-flexible board. The bendable area of the rigid-flexible board or the flexible board is made of polyimide, which is complicated to manufacture and has a high cost. The bendable area of the semi-flexible board usually has a bendable area with a single-layer or double-layer of conductive wiring, thus the semi-flexible board has a low wiring density.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

One embodiment of a method for manufacturing a bendable circuit board includes the following steps:

S1, providing a circuit substrate which is a double-sided circuit board;

S2, pressing a first flexible film and a first release film on a side of the circuit substrate in said order, the first release film covering the first flexible film;

S3, providing a first rigid wiring board and a second rigid wiring board, and pressing the first rigid wiring board and the second rigid wiring board on two sides of the structure obtained in the step S2, the first rigid wiring board covering the first release film;

S4, pressing a second flexible film and a second release film on a side of the second rigid wiring board away from the first rigid wiring board, the second flexible film corresponding to the first flexible film, the second release film covering the second flexible film;

S5, providing a third rigid wiring board and a fourth rigid wiring board, and pressing the third rigid wiring board and the fourth rigid circuit board on two sides of the structure obtained in the step S4, the third rigid wiring board covering the second release film;

S6, providing a fifth rigid wiring board and a sixth rigid wiring board, and pressing the fifth rigid wiring board and the sixth rigid wiring board on two sides of the structure obtained in the step S5, the fifth rigid wiring board abutting the third rigid wiring board, the sixth rigid wiring board abutting the fourth rigid wiring board;

S7, removing the first release film and portions of the first rigid wiring board, the fourth rigid wiring board, and the sixth rigid wiring board to expose the first flexible film, and removing the second release film and portions of the third rigid wiring board and the fifth rigid wiring board to expose the second flexible film, to obtain the bendable circuit board.

FIGS. 1 to 8 show a process of manufacturing a bendable circuit board 100.

Figure 1:
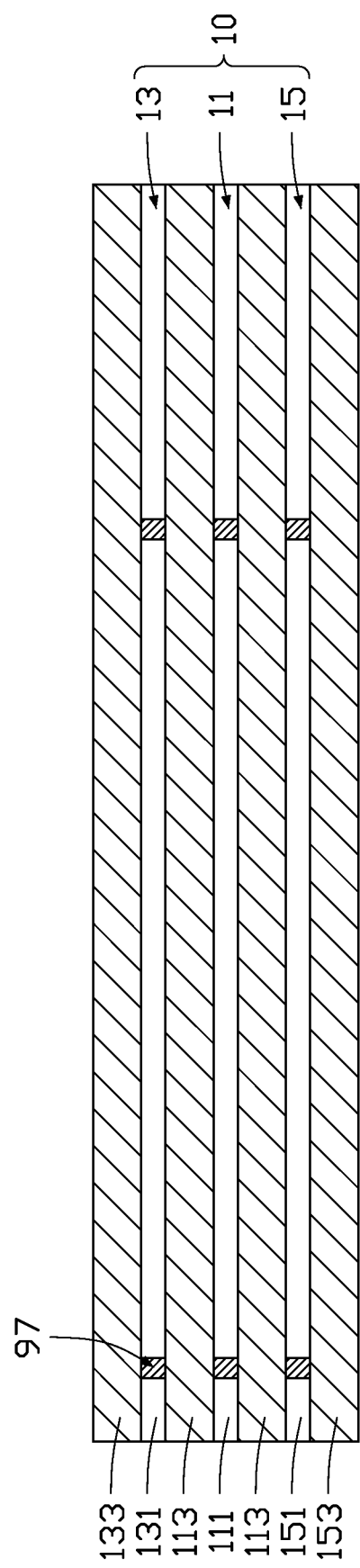
FIG. 1 is a schematic view of an embodiment of a circuit substrate.

Referring to FIG. 1, in step S1, a circuit substrate 10 is provided, the circuit substrate 10 is a double-sided circuit board. The circuit substrate 10 is a rigid circuit board, and includes at least two wiring layers. In the embodiment, the circuit substrate 10 includes four wiring layers. It is to be understood, the circuit substrate 10 can have two, three, four, or more wiring layers.

Specifically, the circuit substrate 10 includes an inner circuit board 11, a first wiring board 13, and a second wiring board 15, the inner circuit board 11 is sandwiched between the first wiring board 13 and the second wiring board 15. The inner circuit board 11 includes an insulation layer 111 and two conductive wiring layers 113, the insulation layer 111 is sandwiched between the two conductive wiring layers 113. The first wiring board 13 is a single-sided circuit board, and includes a substrate layer 131 and a conductive wiring layer 133 formed on a side of the substrate layer 131. The substrate layer 131 is in contact with the conductive wiring layer 113 on one side of the inner circuit board 11. The second wiring board 15 is a single-sided circuit board, and includes a substrate layer 151 and a conductive wiring layer 153. The substrate layer 151 is in contact with the conductive wiring layer 113 on other side of the inner circuit board 11.

It is to be understood, the circuit substrate 10 as provided includes a plurality of conductive holes 97 formed on the insulation layer 111, the substrate layer 131, and the substrate layer 151 respectively to electrically connect various conductive wiring layers. Specifically, the insulation layer 111, the substrate layer 131, and the substrate layer 151 are provided with through holes, and the through holes are infilled or electroplated with conductive material to form conductive holes 97.

Figure 2:
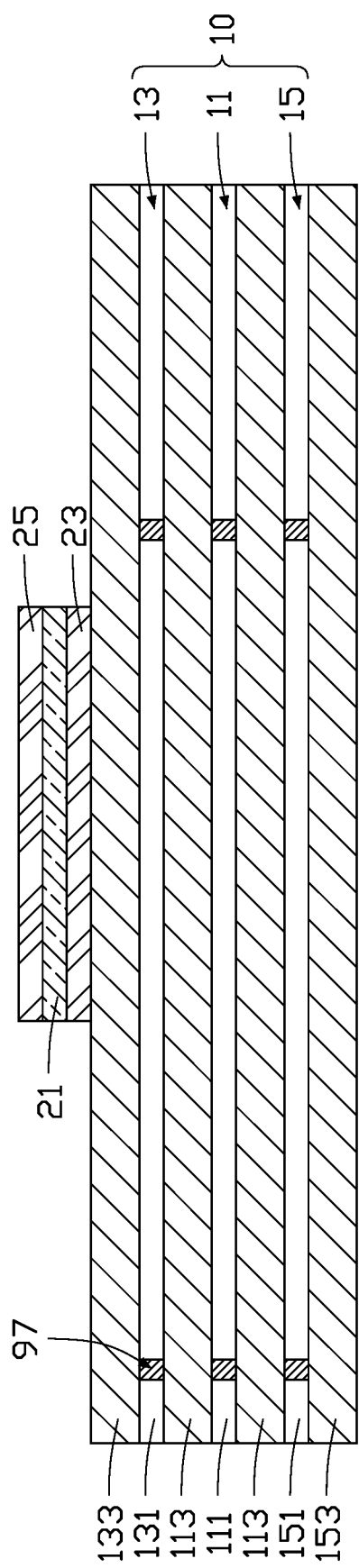
FIG. 2 is a schematic view showing a first flexible film pressed to a side of the circuit substrate of FIG. 1.

Referring to FIG. 2, in step S2, a first flexible film 21 and a first release film 25 are pressed on a side of the circuit substrate 10 in said order. The first flexible film 21 is in contact with the conductive wiring layer 133 of the first wiring board 13. The first flexible film 21 is pressed on the first wiring board 13 against a first adhesive layer 23. In the embodiment, the first flexible film 21 is substantially located on the center of the circuit substrate 10. The first release film 25 may completely or partially cover the first flexible film 21. In the embodiment, the first release film 25 completely covers the first flexible film 21.

Figure 3:
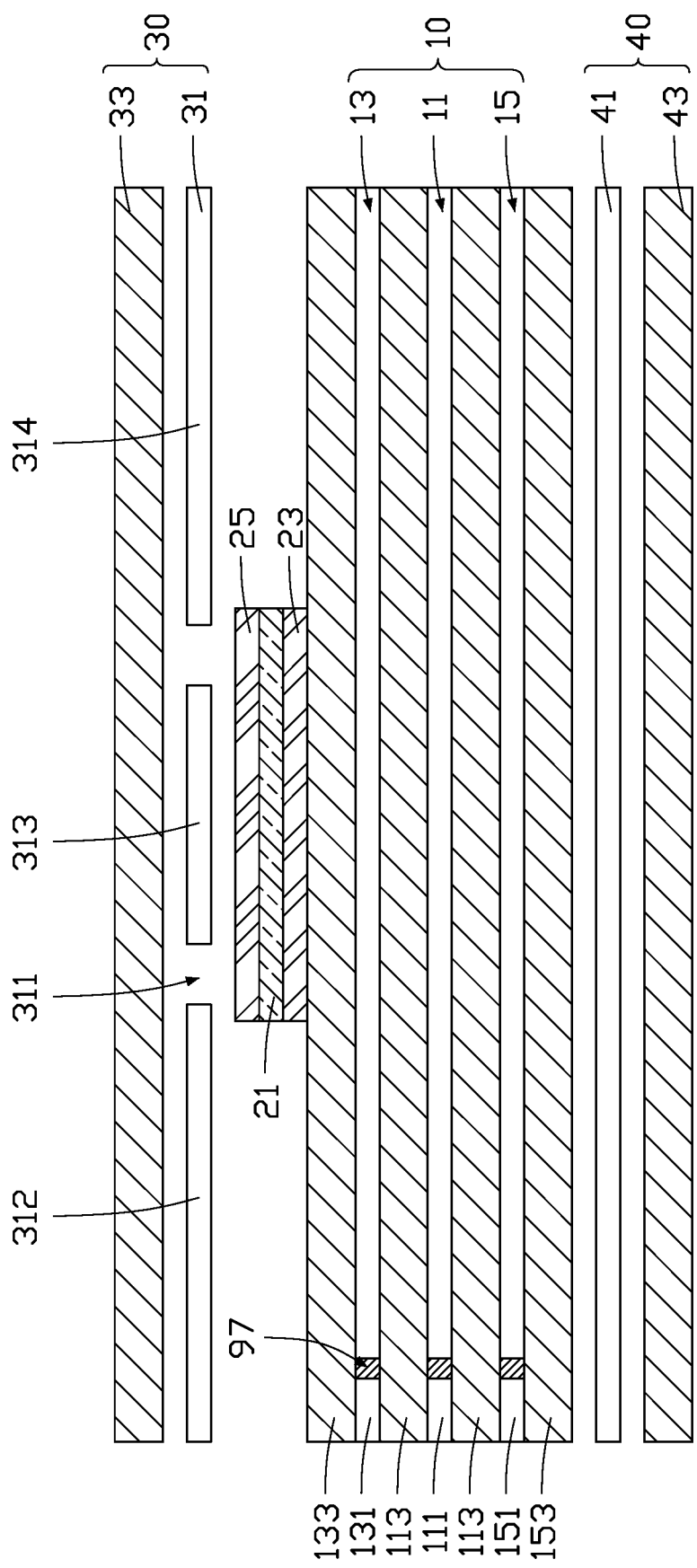
FIG. 3 is a schematic view showing a first rigid wiring board and a second rigid wiring board pressed to sides of the structure shown in FIG. 2.

Referring to FIG. 3, in step S3, a first rigid wiring board 30 and a second rigid wiring board 40 are provided, and the first rigid wiring board 30 and the second rigid wiring board 40 are pressed on outer sides of the structure obtained in the step S2. The first rigid wiring board 30 covers the first release film 25 and portion of the conductive wiring layer 133 of the first wiring board 13.

The first rigid wiring board 30 is a single-sided circuit board, and includes a substrate layer 31 and a conductive wiring layer 33 formed on a side of the substrate layer 31. The substrate layer 31 covers the first release film 25 and portion of the conductive wiring layer 133 of the first wiring board 13.

Before the first rigid wiring board 30 is pressed into place, the substrate layer 31 is cut to form two openings 311 corresponding to two ends of the first release film 25 such that the substrate layer 31 is divided into a first portion 312, a second portion 313, and a third portion 314 spaced away from each other. The first portion 312 and the third portion 314 are on either side of the first release film 25. The second portion 313 covers the first release film 25 to avoid damage to the first flexible film 21 during subsequent laser cutting.

The second rigid wiring board 40 is a single-sided circuit board, and includes a substrate layer 41 and a conductive wiring layer 43 formed on a side of the substrate layer 41. The substrate layer 41 is in contact with the circuit substrate 10.

Figure 4:
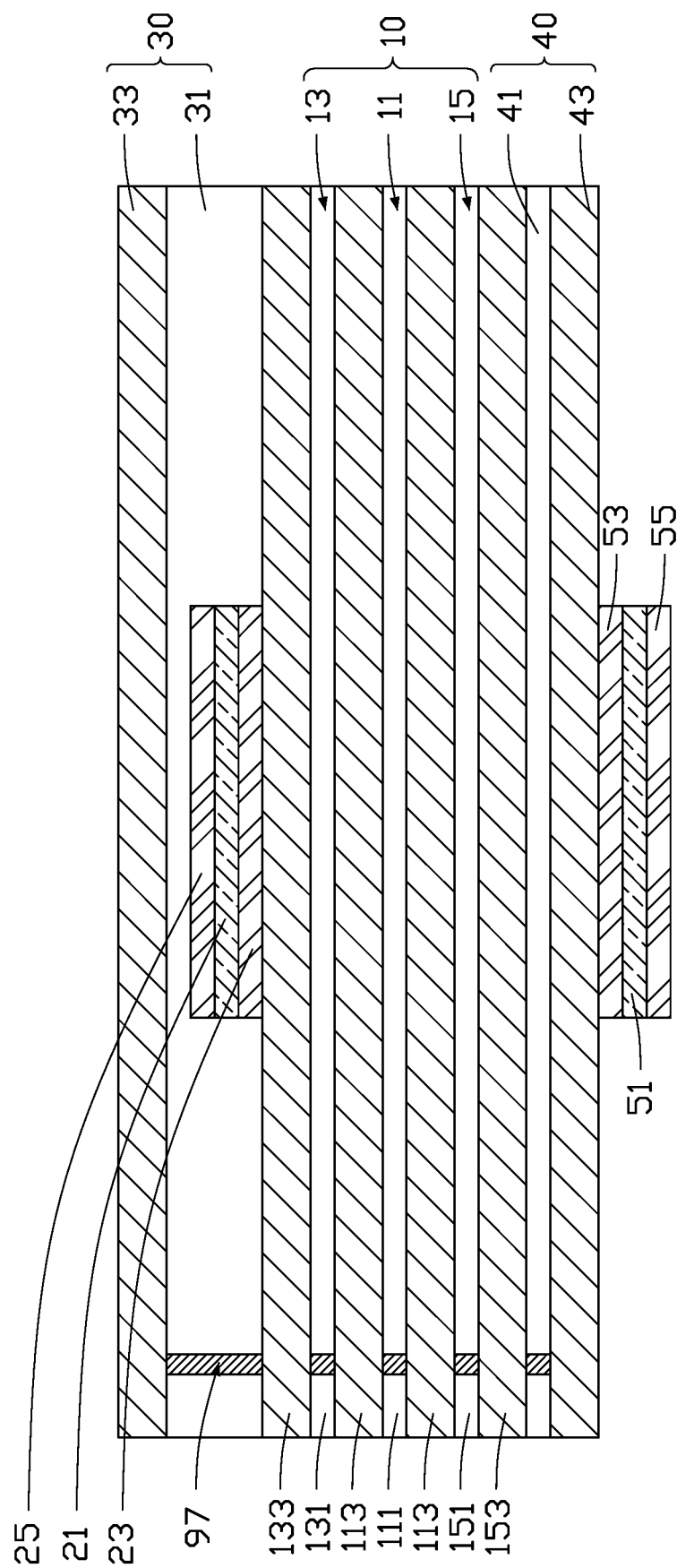
FIG. 4 is a schematic view showing a second flexible film pressed on a side of the structure shown in FIG. 3.

Referring to FIG. 4, in step S4, a second flexible film 51 and a second release film 55 are pressed in said order on a side of the second rigid wiring board 40 away from the circuit substrate 10. The position of the second flexible film 51 corresponds to the position of the first flexible film 21. The second flexible film 51 is pressed on the second rigid wiring board 40 against a second adhesive layer 53. The second release film 55 is coated on a side of the second flexible film 51 away from the second rigid wiring board 40. The second release film 55 may completely or partially cover the second flexible film 51. In the embodiment, the second release film 55 completely covers the second flexible film 51.

In the bendable circuit board 100, the area between the first flexible film 21 and the second flexible film 51 is a bendable area. A distance between the first flexible film 21 and the second flexible film 51 is about 1~5 mm, that is, the bendable area has a thickness of about 1~5 mm.

The first adhesive layer 23 and the second adhesive layer 53 both include a resin, which may be one or more of polypropylene, epoxy resin, polyurethane, phenolic resin, urea-formaldehyde resin, melamine-formaldehyde resin, and polyimide.

The first flexible film 21 and the second flexible film 51 are both made of flexible insulation materials, such as polyimide, polyethylene, or polycarbonate.

The first rigid wiring board 30 and the second rigid wiring board 40 provided in step S3 includes a plurality of conductive holes 97 formed on the substrate layers 31 and 41 to electrically connect various conductive wiring layers.

Figure 5:
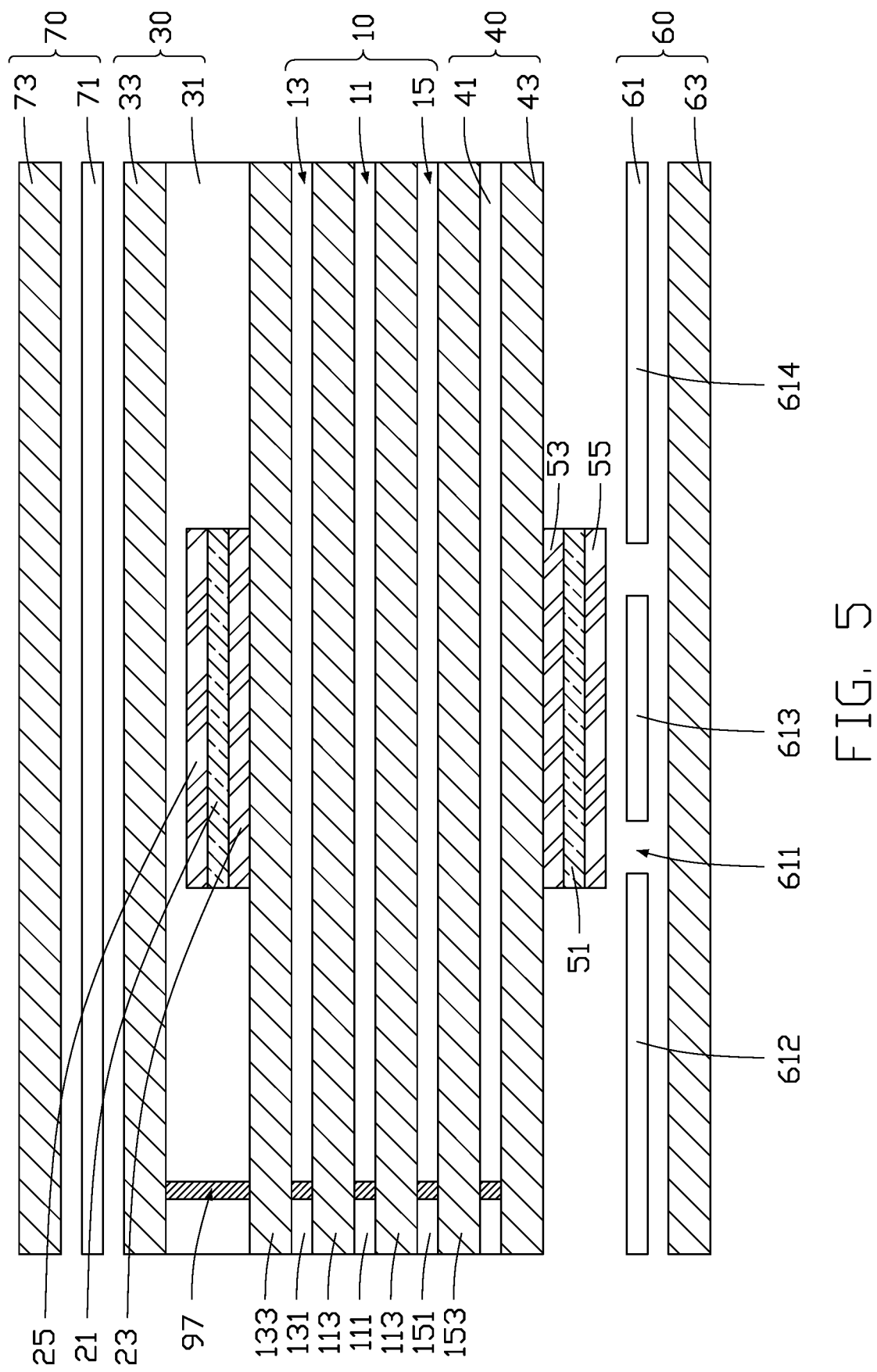
FIG. 5 is a schematic view showing a third rigid wiring board and a fourth rigid wring board pressed to sides of the structure shown in FIG. 4.

Referring to FIG. 5, in step S5, a third rigid wiring board 60 and a fourth rigid wiring board 70 are provided, and the third rigid wiring board 60 and the fourth rigid wiring board 70 are pressed on outer sides of the structure obtained in the step S4, wherein the third rigid wiring board 60 covers the second flexible film 51.

The third rigid wiring board 60 is a single-sided circuit board, and includes a substrate layer 61 and a conductive wiring layer 63 formed on a side of the substrate layer 61. The substrate layer 61 covers the second release film 55 and a portion of the conductive wiring layer 43 of the second rigid wiring board 40.

Before the third rigid wiring board 60 is pressed into place, the substrate layer 61 is cut to form two openings 611 corresponding to the ends of the second release film 55 such that the substrate layer 61 is divided into a first portion 612, a second portion 613, and a third portion 614 spaced away from each other. The first portion 612 and the third portion 614 are located on either side of the second release film 55. The second portion 613 covers the second release film 55 to avoid damage to the second flexible film 51 during subsequent laser cutting.

The fourth rigid wiring board 70 is a single-sided circuit board, and includes a substrate layer 71 and a conductive wiring layer 73 formed on a side of the substrate layer 71. The substrate layer 71 is in contact with the conductive wiring layer 33 of the first rigid wiring board 30.

The third rigid wiring board 60 and the fourth rigid wiring board 70 provided in step S5 includes a plurality of conductive holes 97 formed on substrate layers 61 and 71 to electrically connect various conductive wiring layers.

Figure 6:
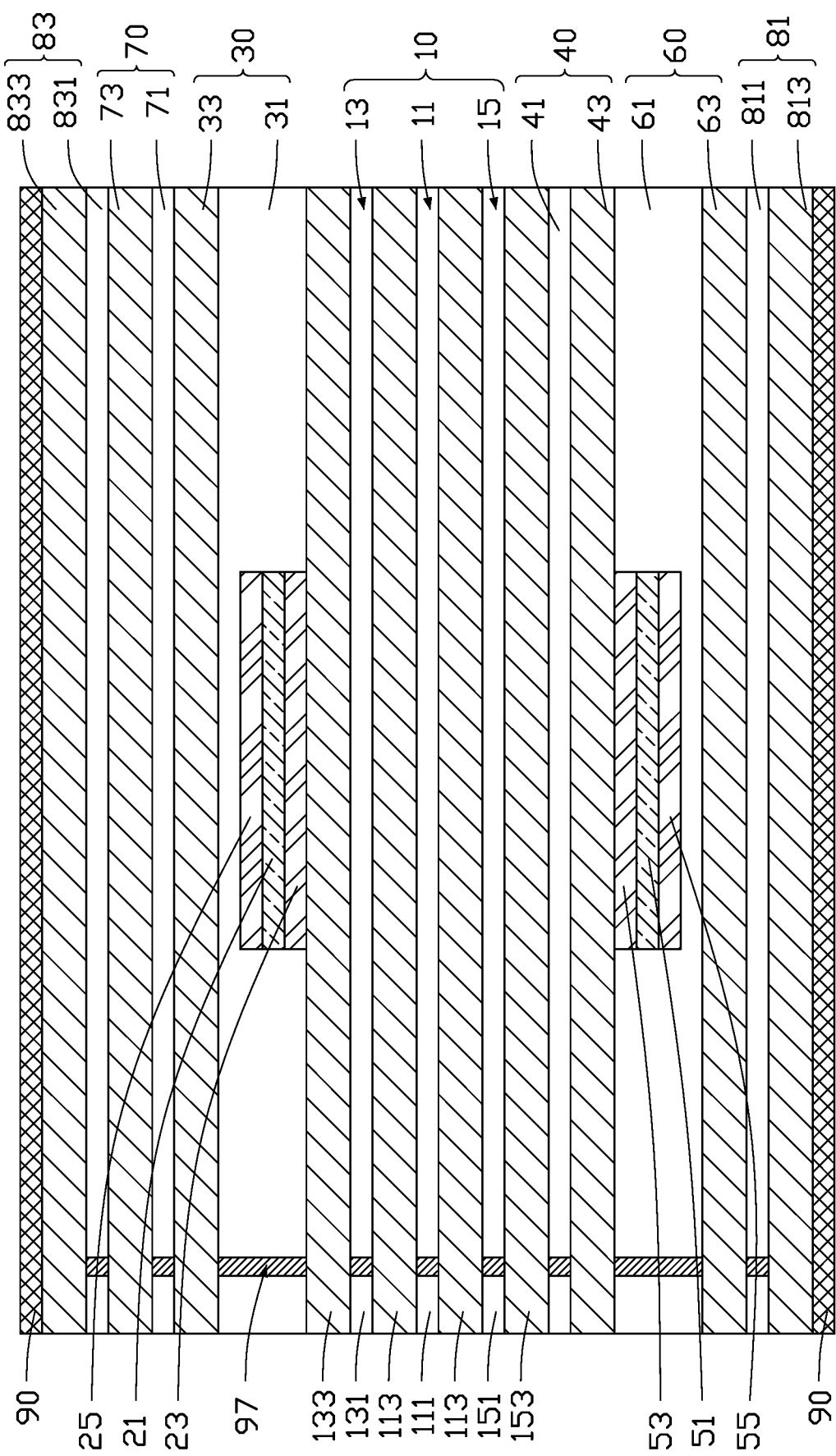
FIG. 6 is a schematic view showing a fifth rigid wiring board and a sixth rigid wiring board pressed to sides of the structure shown in FIG. 5.

Referring to FIG. 6, in step S6, a fifth rigid wiring board 81 and a sixth rigid wiring board 83 are provided, and the fifth rigid wiring board 81 and the sixth rigid wiring board 83 are pressed on outer sides of the structure obtained in the step S5, wherein the fifth rigid wiring board 81 is in contact with the third rigid wiring board 60, and the sixth rigid wiring board 83 is in contact with the fourth rigid wiring board 70.

The fifth rigid wiring board 81 is a single-sided circuit board, and includes a substrate layer 811 and a conductive wiring layer 813 formed on a side of the substrate layer 811. The substrate layer 811 is in contact with the conductive wiring layer 63 of the third rigid wiring board 60.

The sixth rigid wiring board 83 is a single-sided circuit board, and includes a substrate layer 831 and a conductive wiring layer 833 formed on a side of the substrate layer 831. The substrate layer 831 is in contact with the conductive wiring layer 73 of the fourth rigid wiring board 70.

The substrate layer 131 of the first wiring board 13, the substrate layer 151 of the second wiring board 15, the substrate layer 31 of the first rigid wiring board 30, the substrate layer 41 of the second rigid wiring board 40, the substrate layer 61 of the third rigid wiring board 60, the substrate layer 71 of the fourth rigid wiring board 70, the substrate layer 811 of the fifth rigid wiring board 81, and the substrate layer 831 of the sixth rigid wiring board 83 are all made of prepreg (PP) including glass fiber and epoxy resin.

The fifth rigid wiring board 81 and the sixth rigid wiring board 83 provided in step S6 includes a plurality of conductive holes 97 formed on the substrate layers 811 and 831 to electrically connect various conductive wiring layers.

If the full number of layers of the bendable circuit board 100 is not required, the fourth rigid wiring board 70 and/or the fifth rigid wiring board 81 and/or the sixth rigid wiring board 83 can be omitted. Conversely, additional layers of the bendable circuit board 100 can be added if required, the rigid circuit board can be further pressed on the outside of the fifth rigid wiring board 81 and/or the sixth rigid wiring board 83, thereby obtaining the bendable circuit board 100 with a greater number of conductive wiring layers.

Adjusting the number of rigid wiring boards formed on the outsides of the first flexible film 21 and the second flexible film 51 allows the bendable area to be located at any position of the bendable circuit board 100, such as at a middle position, a middle upper position, a middle lower position, etc.

Figure 7:
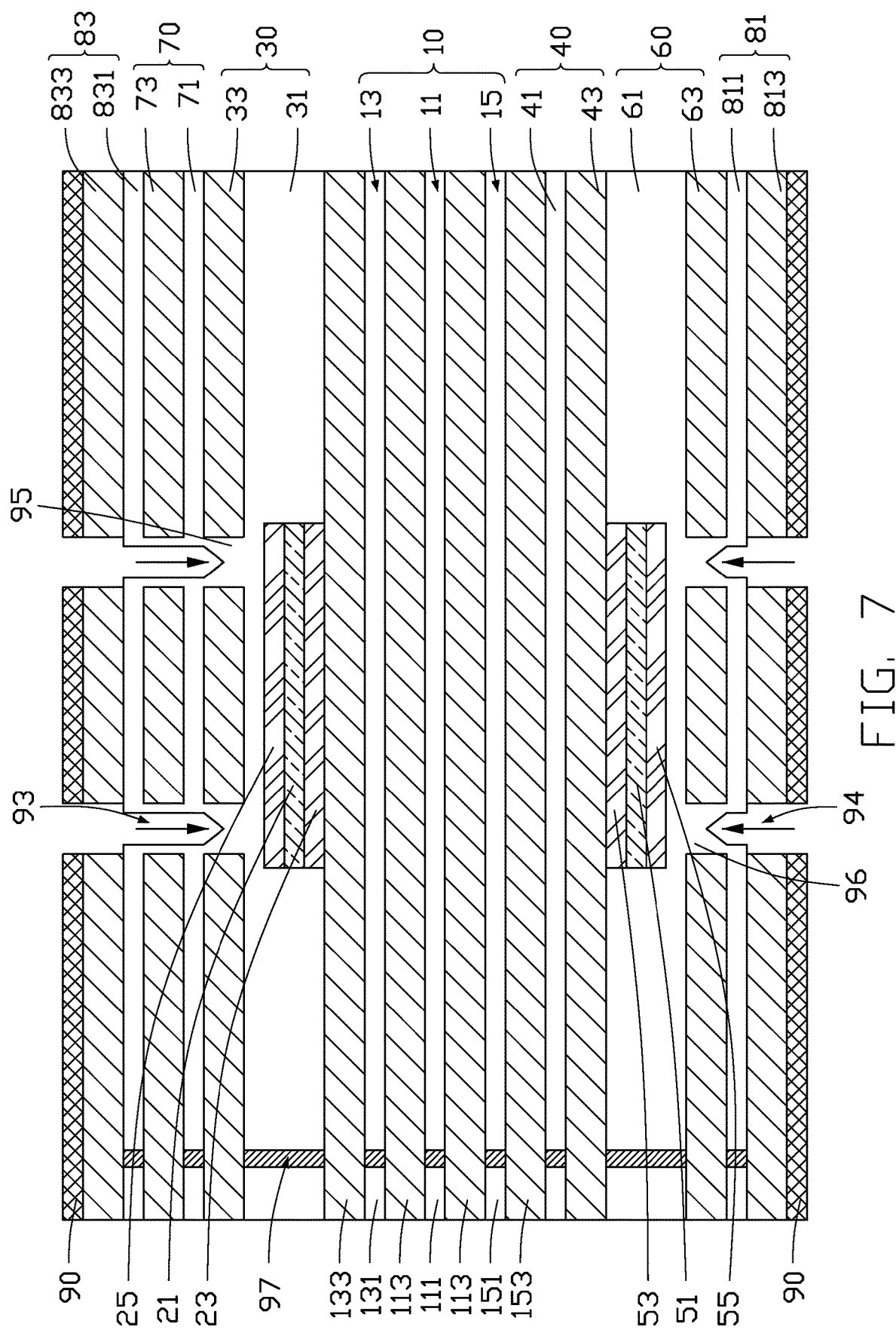
FIG. 7 is a schematic view showing the structure shown in FIG. 6 being cut.
Figure 8:
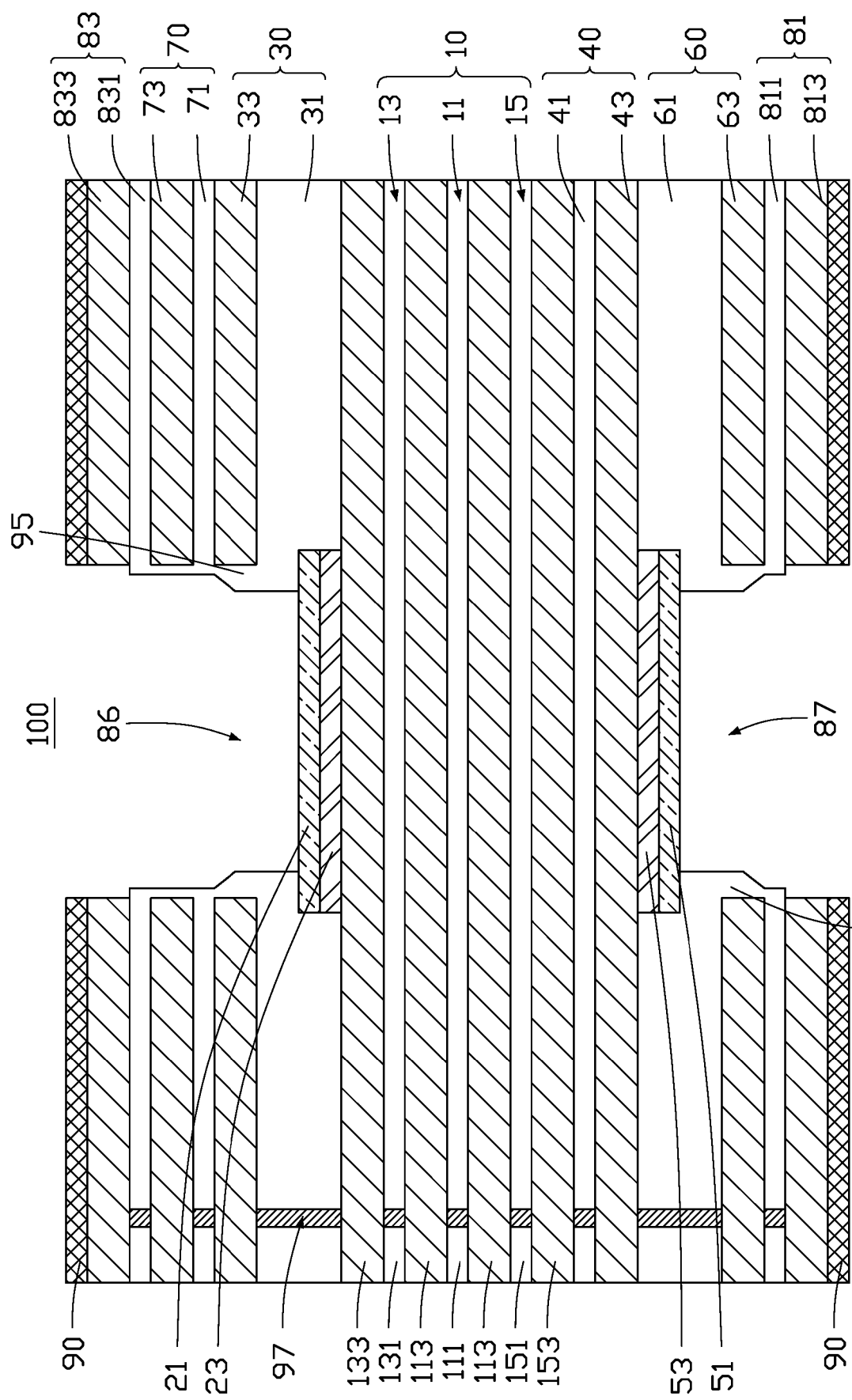
FIG. 8 is a schematic view of an embodiment of a bendable circuit board.

Referring to FIGS. 7 and 8, in step S7, the first release film 25 and portions of the first rigid wiring board 30, the fourth rigid wiring board 70, and the sixth rigid wiring board 83 corresponding to the first flexible film 21 are removed to form a first window area 86 exposing the first flexible film 21. The second release film 55 and portions of the third rigid wiring board 60 and the fifth rigid wiring board 81 corresponding to the second flexible film 51 are removed to form a second window area 87 exposing the second flexible film 51, such that the bendable circuit board 100 is obtained.

Referring to FIG. 6, before step S7, two protective layers 90 are formed on the outer sides of the fifth rigid wiring board 81 and the sixth rigid wiring board 83. One protective layer 90 covers the conductive wiring layer 813 of the fifth rigid wiring board 81, and other protective layer 90 covers the conductive wiring layer 833 of the sixth rigid wiring board 83. The protective layer 90 may be made of insulating ink applied by printing.

The step S7 includes the following sub steps. First, the sixth rigid wiring board 83, the fourth rigid wiring board 70, and the first rigid wiring board 30 are cut along the two edges of the first release film 25 by laser cutting to form two first slits 93. The fifth rigid wiring board 81 and the third rigid wiring board 60 are cut along the two edges of the second release film 55 by laser cutting to form two second slits 94. Then portions of the sixth rigid wiring board 83, the fourth rigid wiring board 70, and the first rigid wiring board 30 corresponding to the first flexible film 21 are removed by peeling away the first release film 25 to form the first window area 86. Portions of the third rigid wiring board 60 and the fifth rigid wiring board 81 corresponding to the second flexible film 51 are removed by peeling away the second release film 55 to form the second window area 87. The first flexible film 21 is exposed in the first window area 86, and the second flexible film 51 is exposed in the second window area 87.

When performing laser cutting, the predetermined cutting depth along the edges of the first release film 25 avoids damage to the first flexible film 21 by not extending to the first rigid wiring board 30. To avoid damage to the second flexible film 51, the predetermined cutting depth along the edges of the second release film 55 does not extend to the third rigid wiring board 60.

When laser cutting, the epoxy resins in the first rigid wiring board 30, the fourth rigid wiring board 70, and the sixth rigid wiring board 83 will melt and overflow along the side wall of the first slits 93. After removing the portions of the first release film 25, the first rigid wiring board 30, the fourth rigid wiring board 70, and the sixth rigid wiring board 83 corresponding to the first flexible film 21, the overflow of epoxy resin covers edge areas of the first flexible film 21 to form a first resin layer 95 protecting the first flexible film 21. The first resin layer 95 has a width of about 0~0.5 mm.

When laser cutting, the epoxy resins in the third rigid wiring board 60 and the fifth rigid wiring board 81 will melt and overflow along the side wall of the second slits 94. After removing the portions of the second release film 55, the third rigid wiring board 60, and the fifth rigid wiring board 81 corresponding to the second flexible film 51, the overflow of epoxy resin covers edge areas of the second flexible film 51 to form a second resin layer 96 protecting the second flexible film 51. The second resin layer 96 has a width of about 0~0.5 mm.

Referring to FIG. 8, in one embodiment, a bendable circuit board 100 is provided. The bendable circuit board 100 includes, stacked in this order, a fifth rigid wiring board 81, a third rigid wiring board 60, a second flexible film 51, a second rigid wiring board 40, a circuit substrate 10, a first flexible film 21, a first rigid wiring board 30, a fourth rigid wiring board 70, and a sixth rigid wiring board 83. The first rigid wiring board 30, the fourth rigid wiring board 70, and the sixth rigid wiring board 83 define a first window area 86 corresponding to the first flexible film 21, and the first flexible film 21 is exposed in the first window area 86. The third rigid wiring board 60 and the fifth rigid wiring board 81 define a second window area 87 corresponding to the second flexible film 51, the second flexible film 51 is exposed in the second window area 87. The area between the first flexible film 21 and the second flexible film 51 is a bendable area. A distance between the first flexible film 21 and the second flexible film 51 is about 1~5 mm, that is, the bendable area has a thickness of about 1~5 mm.

The circuit substrate 10 is a rigid circuit board, and includes at least two wiring layers. In the embodiment, the circuit substrate 10 includes four wiring layers. It is to be understood, the circuit substrate 10 can have two, three, four, or more wiring layers.

Specifically, the circuit substrate 10 includes an inner circuit board 11 and a first wiring board 13 and a second wiring board 15 on outer sides of the inner circuit board 11. The inner circuit board 11 includes an insulation layer 111 and two conductive wiring layers 113, the insulation layer 111 is sandwiched between the two conductive wiring layers 113. The first wiring board 13 is a single-sided circuit board, and includes a substrate layer 131 and a conductive wiring layer 133 formed on a side of the substrate layer 131. The substrate layer 131 makes contact with the conductive wiring layer 113 on one side of the inner circuit board 11. The second wiring board 15 is a single-sided circuit board, and includes a substrate layer 151 and a conductive wiring layer 153. The substrate layer 151 makes contact with the conductive wiring layer 113 on other side of the inner circuit board 11.

The first flexible film 21 makes contact with the conductive wiring layer 133 of the first wiring board 13. The first flexible film 21 is pressed on the first wiring board 13 against a first adhesive layer 23. In the embodiment, the first flexible film 21 is substantially located on the center of the circuit substrate 10.

The first rigid wiring board 30 is a single-sided circuit board, and includes a substrate layer 31 and a conductive wiring layer 33 formed on a side of the substrate layer 31. The substrate layer 31 covers the first flexible film 21.

The second rigid wiring board 40 is a single-sided circuit board, and includes a substrate layer 41 and a conductive wiring layer 43 formed on a side of the substrate layer 41. The substrate layer 41 makes contact with the circuit substrate 10.

The second flexible film 51 is disposed on a side of the second rigid wiring board 40 away from the circuit substrate 10, and pressed on the second rigid wiring board 40 against a second adhesive layer 53.

The first adhesive layer 23 and the second adhesive layer 53 both include a resin, which may be one or more of polypropylene, epoxy resin, polyurethane, phenolic resin, urea-formaldehyde resin, melamine-formaldehyde resin, and polyimide.

The first flexible film 21 and the second flexible film 51 are both made of insulation materials, such as polyimide, polyethylene, or polycarbonate.

The third rigid wiring board 60 is a single-sided circuit board, and includes a substrate layer 61 and a conductive wiring layer 63 formed on a side of the substrate layer 61. The substrate layer 61 covers the second flexible film 51 and a portion of the conductive wiring layer 43 of the second rigid wiring board 40.

The fourth rigid wiring board 70 is a single-sided circuit board, and includes a substrate layer 71 and a conductive wiring layer 73 formed on a side of the substrate layer 71. The substrate layer 71 makes contact with the conductive wiring layer 33 of the first rigid wiring board 30.

The fifth rigid wiring board 81 is a single-sided circuit board, and includes a substrate layer 811 and a conductive wiring layer 813 formed on a side of the substrate layer 811. The substrate layer 811 makes contact with the conductive wiring layer 63 of the third rigid wiring board 60.

The sixth rigid wiring board 83 is a single-sided circuit board, and includes a substrate layer 831 and a conductive wiring layer 833 formed on a side of the substrate layer 831. The substrate layer 831 makes contact with the conductive wiring layer 73 of the fourth rigid wiring board 70.

The substrate layer 131 of the first wiring board 13, the substrate layer 151 of the second wiring board 15, the substrate layer 31 of the first rigid wiring board 30, the substrate layer 41 of the second rigid wiring board 40, the substrate layer 61 of the third rigid wiring board 60, the substrate layer 71 of the fourth rigid wiring board 70, the substrate layer 811 of the fifth rigid wiring board 81, and the substrate layer 831 of the sixth rigid wiring board 83 are all made of prepreg (PP) including glass fiber and epoxy resin.

The number of layers of the bendable circuit board 100 may be fewer, the fourth rigid wiring board 70 and/or the fifth rigid wiring board 81 and/or the sixth rigid wiring board 83 can be omitted. Additional layers can be added to the bendable circuit board 100 if needed, the rigid circuit board can be further pressed on the outside of the fifth rigid wiring board 81 and/or the sixth rigid wiring board 83, thereby obtaining the bendable circuit board 100 with greater number of conductive wiring layers.

In an alternative embodiment, the bendable circuit board 100 further includes two protective layers 90 formed on the outer sides of the fifth rigid wiring board 81 and the sixth rigid wiring board 83. One protective layer 90 covers the conductive wiring layer 813 of the fifth rigid wiring board 81, and other protective layer 90 covers the conductive wiring layer 833 of the sixth rigid wiring board 83. The protective layer 90 may be made of insulating ink applied by printing.

In an alternative embodiment, the bendable circuit board 100 further includes a first resin layer 95 and a second resin layer 96. The first resin layer covers the surface of the first flexible film 21, and the second resin layer 96 covers the surface of the second flexible film 51. Each of the first resin layer 95 and the second resin layer 96 has a width of about 0~0.5 mm.

The bendable circuit board 100 includes a plurality of conductive holes 97 for electrically connecting various conductive wiring layers.

In the bendable circuit board 100, the flexible films are pressed on sides of a rigid laminate structure to render the board bendable, and the product cost is lowered. In additional, the rigid laminate structure in the bendable area includes the circuit substrate 10 which is a double-sided circuit board and the second rigid wiring board 40, that is, the bendable area includes a plurality of conductive wiring layers, thus the wiring density and integration of the bendable circuit board 100 are improved.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A bendable circuit board comprising: a first rigid wiring board, a first flexible film, a circuit substrate, a second rigid wiring board, a second flexible film, and a third rigid wiring board stacked in said order, wherein the circuit substrate is a rigid double-sided circuit board, the first rigid wiring board defines a first window area exposing the first flexible film, and the third rigid wiring board defines a second window area exposing the second flexible film, the second window area is arranged corresponding to the first window area; wherein the circuit substrate comprises an inner circuit board, a first wiring board, and a second wiring board, the first wiring board and the second wiring board are respectively disposed on two sides of the inner circuit board; wherein the inner circuit board comprises an insulation layer and two conductive wiring layers respectively disposed on two sides of the insulation layer; and wherein each of the first wiring board and the second wiring board comprises a substrate layer and a conductive wiring layer disposed on the substrate layer, the substrate layer is in contact with the corresponding one conductive wiring layer.

2. The bendable circuit board of claim 1, further comprising a first resin layer coated on edge areas of the first flexible film and a second resin layer coated on edge areas of the second flexible film.

3. The bendable circuit board of claim 1, further comprising a fourth rigid wiring board disposed on a side of the first rigid wiring board away from the first flexible film, the first window area passing through the fourth rigid wiring board.

4. The bendable circuit board of claim 1, further comprising a protective layer, wherein the protective layer is on an outside of the bendable circuit board.

5. A method for manufacturing a bendable circuit board comprising: providing a circuit substrate which is a double-sided circuit board; pressing a first flexible film and a first release film on a side of the circuit substrate in said order, the first release film covering the first flexible film; providing a first rigid wiring board and a second rigid wiring board, and pressing the first rigid wiring board and the second rigid wiring board on two sides of the structure obtained in the previous step, the first rigid wiring board covering the first release film; pressing a second flexible film and a second release film on a side of the second rigid wiring board away from the first rigid wiring board, the second flexible film corresponding to the first flexible film, the second release film covering the second flexible film; providing a third rigid wiring board, and pressing the third rigid wiring board on a side of the second release film; removing the first release film and a portion of the first rigid wiring board corresponding to the first flexible film to form a first window area exposing the first flexible film, and removing the second release film and a portion of the third rigid wiring board corresponding to the second flexible film to form a second window area exposing the second flexible film, thus to obtain the bendable circuit board, the second window area being arranged corresponding to the first window area; wherein the circuit substrate comprises an inner circuit board, a first wiring board, and a second wiring board, the first wiring board and the second wiring board are respectively disposed on both sides of the inner circuit board; wherein the inner circuit board comprises an insulation layer and two conductive wiring layers respectively disposed on both sides of the insulation layer; and wherein each of the first wiring board and the second wiring board comprises a substrate layer and a conductive wiring layer disposed on the substrate layer, the substrate layer is in contact with the corresponding one conductive wiring layer.

6. The method of claim 5, wherein when the first release film and the portion of the first rigid wiring board corresponding to the first flexible film are removed, epoxy resin of the first rigid wiring board melts and overflows to a surface of the first flexible film to form a first resin layer; when the second release film and the portion of the third rigid wiring board corresponding to the second flexible film are removed, epoxy resin of the third rigid wiring board melts and overflows to a surface of the second flexible film to form a second resin layer.

7. The method of claim 5, wherein the bendable circuit board further comprises a fourth rigid wiring board disposed on a side of the first rigid wiring board away from the first flexible film, the first window area passes through the fourth rigid wiring board.

8. The method of claim 7, wherein the first rigid wiring board comprises a substrate layer, the substrate layer of the first rigid wiring board covers the first release film; before pressing the first rigid wiring board, the substrate layer of the first rigid wiring board is cut to form two openings corresponding to ends of the first release film respectively.

9. The method of claim 8, wherein removing the first release film and the portion of the first rigid wiring board corresponding to the first flexible film comprises cutting the fourth rigid wiring board and the first rigid wiring board along two edges of the first release film, wherein a predetermined cutting depth does not extend to the first rigid circuit board.

10. The method of claim 5, wherein the bendable circuit board further comprises a protective layer, the protective layer is on an outside of the bendable circuit board.

* * * * *